United States Patent [19]

Mutterlein et al.

[11] Patent Number: 5,413,313
[45] Date of Patent: May 9, 1995

[54] INTEGRATED POWER SWITCH STRUCTURE HAVING A VERTICAL THYRISTOR CONTROLLED BY A LATERAL MOS TRANSISTOR

[75] Inventors: Bernward Mutterlein, Duisburg; Holger Vogt, Mülheim, both of Germany

[73] Assignee: Fraunhofer-Gesellschaft zur Forderung der angewandten Forschung e.V., Munich, Germany

[21] Appl. No.: 87,799
[22] PCT Filed: Jan. 7, 1992
[86] PCT No.: PCT/DE92/00011
  § 371 Date: Jul. 8, 1993
  § 102(e) Date: Jul. 8, 1993
[87] PCT Pub. No.: WO92/12541
  PCT Pub. Date: Jul. 23, 1992

[30] Foreign Application Priority Data

Jan. 9, 1991 [DE] Germany .................. 41 00 444.2

[51] Int. Cl.⁶ ................ H01L 29/00; H01L 27/02
[52] U.S. Cl. .................... 257/137; 257/67; 257/109; 257/133; 257/378; 257/379
[58] Field of Search ............ 257/133, 67, 70, 109, 257/137, 378, 379

[56] References Cited

U.S. PATENT DOCUMENTS 4,847,671 7/1989 Pattanayak .................. 357/38

FOREIGN PATENT DOCUMENTS

| 0011443 | 5/1980 | European Pat. Off. | ..... H01L 27/06 |
| 0477594 | 4/1992 | European Pat. Off. | ..... H01L 29/74 |
| 3905149 | 8/1990 | Germany | ..... H01L 21/76 |
| 9010311 | 9/1990 | WIPO | ..... H01L 29/74 |

OTHER PUBLICATIONS

B. J. Baliga, *Electron Device Letters*, vol. 20, 1990, "The MOS-Gated Emitter Switched Thyristor," pp. 75–77.
B. J. Baliga, *Solid State Electronics*, vol. 25, 1982, "High Gain Power Switching Using Field Controlled Thyristors," pp. 345–353.
W. Seifert, A. A. Jaecklin, *IEEE Trans. Elec. Dev.*, vol. 34, 1987, "An FET-Driven Power Thyristor," pp. 1170–1176.

*Primary Examiner*—Ngân V. Ngô
*Attorney, Agent, or Firm*—Ralph H. Dougherty

[57] ABSTRACT

An integrated power switch structure comprises a lateral MOS transistor (3) and a lateral or vertical thyristor (2). The drain-source path of the lateral MOS transistor (3) is in series with the cathode-anode path of the thyristor (2). In order to ensure that the power switch structure reliably switches on and off with great dielectric strength and low switch-on resistance, at least the source electrode of the lateral MOS transistor (3) is insulated against the substrate (7) by means of a buried oxide layer (8) in accordance with the present invention.

10 Claims, 8 Drawing Sheets

INTEGRATED POWER SWITCH STRUCTURE HAVING A VERTICAL THYRISTOR CONTROLLED BY A LATERAL MOS TRANSISTOR

DESCRIPTION

The present invention refers to an integrated power switch structure, which comprises a lateral or a vertical thyristor controlled by a lateral MOS gate and wherein said lateral MOS gate has its drain-source path connected in series with the cathode-anode path of the thyristor according to the generic clause of claim 1.

The present invention deals, in general, with the improvement of a power switch structure which is suitable for switching high loads.

For switching high loads, power DMOS transistors are regarded as being ideal switching elements for the range of low voltages of less than 100 V even in the case of high currents exceeding 10 A. A power DMOS transistor has a low resistance in the switched-on condition and it permits rapid switching on and off. When higher voltages in the range between 500 V and 1500 V are used, the product of the switch-on resistance and the area, which is an important measure of the quality of the component, will increase more and more and become, consequently, more and more disadvantageous in the case of power DMOS transistors.

On the basis of a known power DMOS transistor, which is designated generally by reference numeral 50 in FIG. 5, the reason for the fact that the quality of the component will deteriorate when higher voltages are to be switched will be explained hereinbelow. As can be seen from the figure, such a DMOS transistor 50 comprises a gate 51, a source electrode 52 and a drain electrode 53, which borders on an n+-substrate 54. The known power DMOS transistor 50 includes at each source-electrode region 52 an n+-region 55, which is enclosed by a p-base region 56. An n-drift region 58 is located between the n+-substrate 54 and the p-base regions 56, said n-drift region being defined by a lightly doped semiconductor layer formed by epitaxial growth on the high-doped n+-silicon substrate 54. The dielectric strength of the known DMOS transistor 50 is adjusted via the space-charge zone of a pn-junction extending into the semiconductor layer 58 which has been formed by epitaxial growth. The further the space-charge zone can spread, i.e. the larger the semiconductor layer 58 formed by epitaxial growth is and the lower its doping is, the higher is the dielectric strength of the DMOS transistor 50. On the other hand, the switch-on resistance will increase when the drift distance becomes larger and when the doping becomes lower, since the current has to pass through the layer 58 formed by epitaxial growth.

In order to reduce the epitaxial resistance, a socalled IGBT (Insulated Gate Bipolar Transistor) or IGT, which is shown in FIG. 6 and which is designated generally by reference numeral 60, is used in field of power electronics. With the exception of the differences explained hereinbelow, the structural design of such a transistor corresponds to that of the DMOS transistor 50 which has been explained with regard to FIG. 5, identical parts and regions being designated by like reference numerals. In the case of the IGBT 60 according to FIG. 6, the n+-substrate 54 of the DMOS transistor 50 according to FIG. 5 has been replaced by a p+-substrate 64 which is doped just as highly. The resultant pn-junction between the substrate 64 and the layer 58 formed by epitaxial growth is, in the switched-on condition polarized in the forward direction, connected in series with the actual transistor and injects a large number of minority carriers, i.e. holes, into the layer 58 formed by epitaxial growth. This will have the effect that the resistance of said layer 58 is reduced drastically by one to two orders of magnitude in comparison with the epitaxial resistance of the DMOS transistor 50 according to FIG. 5. It is, however, necessary to limit the charge carrier injection, since, otherwise, a parasitic p+n−pn+-transistor will fire so that the current through the IGBT 60 can no longer be controlled by the MOS gate 51. This control has the advantage that it is effected capacitively via an insulating layer 59 and that, consequently, no static dissipation power will occur. A charging current only flows for switching the transistor over from the non-conducting state to the conducting state or vice versa.

FIG. 7 shows an additional, known power switch structure in the form of a thyristor (GTO), which is designated generally by reference numeral 70. The known thyristor 70 comprises a cathode 71, an anode 72 as well as, between the cathode 71 and the anode 72, a conventional n+pnp+-four-layer structure including an n+-layer 73, a p-base layer 74, an n-base layer 75 and an p+-substrate 76. Furthermore, this known thyristor comprises a control gate 77, which borders with a p+-layer on the p-base layer 74 so that it is possible to switch off this thyristor by applying a negative current to the gate 77.

FIG. 8 shows typical dependences of the conducting voltage on the current density for the following power switch elements: an FET with 600 V blocking voltage, an FET with 300 V blocking voltage, a bipolar transistor with 600 V blocking voltage, a Darlington transistor with 600 V blocking voltage, an IGT with 600 V blocking voltage as well as a thyristor having the same blocking voltage. As will easily be evident from the comparison shown in FIG. 8, the thyristor has, on the basis of the same conducting voltage, by far the highest current related to the chip area. Conventional de-energizeable thyristors, however, show the disadvantage that they require a comparatively high switch-off current, which has to amount to more than 1/10 of the load current. Hence, investigations concerning thyristors, which are adapted to be switched on and off via an MOS gate, have already been made for the purpose of eliminating the disadvantages of the above-explained power switch structures according to the prior art.

For example, the technical publication W. Seifert and A. A. Jaecklin: An FET-Driven Power Thyristor, IEEE Trans. Elec. Dev., Vol. ED-34, Nov. 5, 1987, pages 1170 to 1176, discloses an integrated power switch structure including a vertical thyristor controlled by a lateral MOS gate. This known power switch structure is shown in FIG. 9. The structure comprises three areas, viz. on the left-hand side of FIG. 9 a first gate G1, on the right-hand side of said FIG. 9 the lateral MOS gate G3 as well as, in the central area, the thyristor, which is designated by reference numeral 91. The thyristor comprises a cathode 92, an anode 98 and an n+pnp+-four-layer sequence extending between said cathode 92 and said anode 98 and including the n+-layer 93, the p-base layer 94, the n-base layer 95 and the p+-substrate region 96. The anode connection 98 has a positive voltage applied thereto, whereas the cathode connection 92 has a negative voltage applied thereto. The cathode connection 92 is additionally connected to a p-doped region 97 of the lateral MOS FET G3, 94, 95, 97, which defines the source electrode of said MOS FET. The drain electrode of said lateral MOS FET is connected to the p-base layer 94 or is defined thereby.

When a positive voltage is applied to the gate, electrons from the cathode 92 can be injected via the first gate G1 into the layer 95 formed by epitaxial growth. As can be seen in FIG. 10, the epi-layer is the base of a pnp-transistor T1, which amplifies this current and which sends holes into the p-layer 94. This p-layer 94 defines the base of an npn-transistor T2, which amplifies the current still further and which sends even more electrons into the epi-layer 95. The feedback-coupled transistors T1, T2 cause an increase of current so that the thyristor 91 will switch to the conducting state and become low-ohmic. Only if a strongly negative voltage is applied to the MOS gate G3, the thyristor 91 will block again, since part of the npn-base current will be short-circuited to the thyristor cathode 92 via the lateral PMOS transistor 94, 95, 97 turned on by the MOS gate G3.

This possibility of switching off is, however, limited. If the current in the thyristor exceeds a specific value, it will no longer be possible to discharge sufficient current via the PMOS transistor 94, 95, 97 so that the thyristor will remain switched on. It follows that this possibility of switching off is operating-point dependent and represents an inadmissible factor of uncertainty.

The technical publication B.J. Baliga: The MOS-Gated Emitter Switched Thyristor, IEEE Elec. Dev. Lett., Vol. EDL-11, Nov. 2, 1990, pages 75 to 77, discloses an integrated power switch structure of the type mentioned at the beginning, which comprises a vertical thyristor controlled by a lateral MOS gate and wherein said lateral MOS gate has its drain-source path connected in series with the cathode-anode path of the thyristor. This known power switch structure, which is shown in FIG. 11, is designated generally by reference numeral 100 in said FIG. 11 and comprises in the left part thereof a main thyristor 101 surrounded by a broken line with an n+-layer 102, a p-base layer 103, an n-drift layer 104, an n-buffer layer 105, a p+-anode layer 106, which is followed by an anode 107. The n+-layer 102 of the vertical thyristor or of the main thyristor 101 defines simultaneously the drain electrode of a MOS-FET 108, which is laterally arranged. The cathode of the overall arrangement, which is designated by reference numeral 109, is connected to an additional n+-region 110, which is separated from the n+-region 102 by an intermediate region of the p-base layer 103. An insulated gate 111 of the MOSFET 108 will block the current through the MOS transistor, if it has 0 V applied thereto. The blocking voltage of this known power switch structure drops across the space-charge zone in the EPI layer 101, 105.

However, this known power switch structure has a parasitic thyristor 112, said parasitic thyristor 112 being defined by the four-layer sequence, which comprises the n-region 110, the p-base region 103, the n-drift layer 104, the buffer layer 105 as well as the p+-anode layer 106.

The equivalent circuit of the power switch structure according to FIG. 11 is shown in FIG. 12. The reference numerals corresponding to those of FIG. 11 have been used for identical parts and identical areas, respectively. In the equivalent circuit of FIG. 12, the main thyristor 101 according to FIG. 11 is represented by the two transistors T1, T2 connected in a feedback-connection. Accordingly, the parasitic thyristor 112 according to FIG. 11 is represented by the two transistors T3, T4 connected in a feedback-connection in the equivalent circuit of FIG. 12. As can be seen from said equivalent circuit according to FIG. 12, this known thyristor structure or power switch structure has the disadvantage that the parasitic thyristor 11.2 permits a flow of current via the n+-source electrode of the lateral MOS transistor 108. This current cannot be controlled via the MOS gate 111 and prevents switching off of the thyristor as soon as the current of said thyristor exceeds a specific value.

It follows that the known power switch structures according to FIG. 9 to 12, which can be referred to as MOS gate-controllable thyristors, do not show a satisfactory switch-off behaviour. This is the reason for the fact that these power switch structures, which have hitherto only been suggested in the respective literature, have only been used in laboratory experiments up to now.

DE 3905149 A1 already discloses a power switch means with an integrated CMOS or bipolar circuit, wherein said CMOS or bipolar circuit is arranged on a semiconductor material island shielded against the adjacent semiconductor material by a buried insulating layer as well as a doped layer which is doped contrary to the EPI layer.

With regard to the technological background of the present invention, reference is additionally made to the following publications:

Solid State Electronics, Vol. 25, Nov. 5, 1982, pages 345 to 353.
EP 00 11 443 B1,
DE 39 05 149 A1, and
IEEE Electron Device Letters, Vol. 11, No. 2, February, 1990, pages 75 to 77.

Taking this prior art as a basis, it is the object of the present invention to further develop an integrated power switch structure of the type mentioned at the beginning, which comprises a lateral or a vertical transistor controlled by a lateral MOS gate, in such a way that reliable switching on and off of the power switch structure with low control currents will be achieved, said power switch structure having a great dielectric strength in combination with a low switch-on resistance.

This object is achieved by an integrated power switch structure according to claim 1.

Preferred embodiments of the power switch structure according to the present invention are disclosed in the subclaims.

In the following, two preferred embodiments of the power switch structure according to the present invention will be explained in detail with reference to the drawings enclosed, in which.

Figure 1:
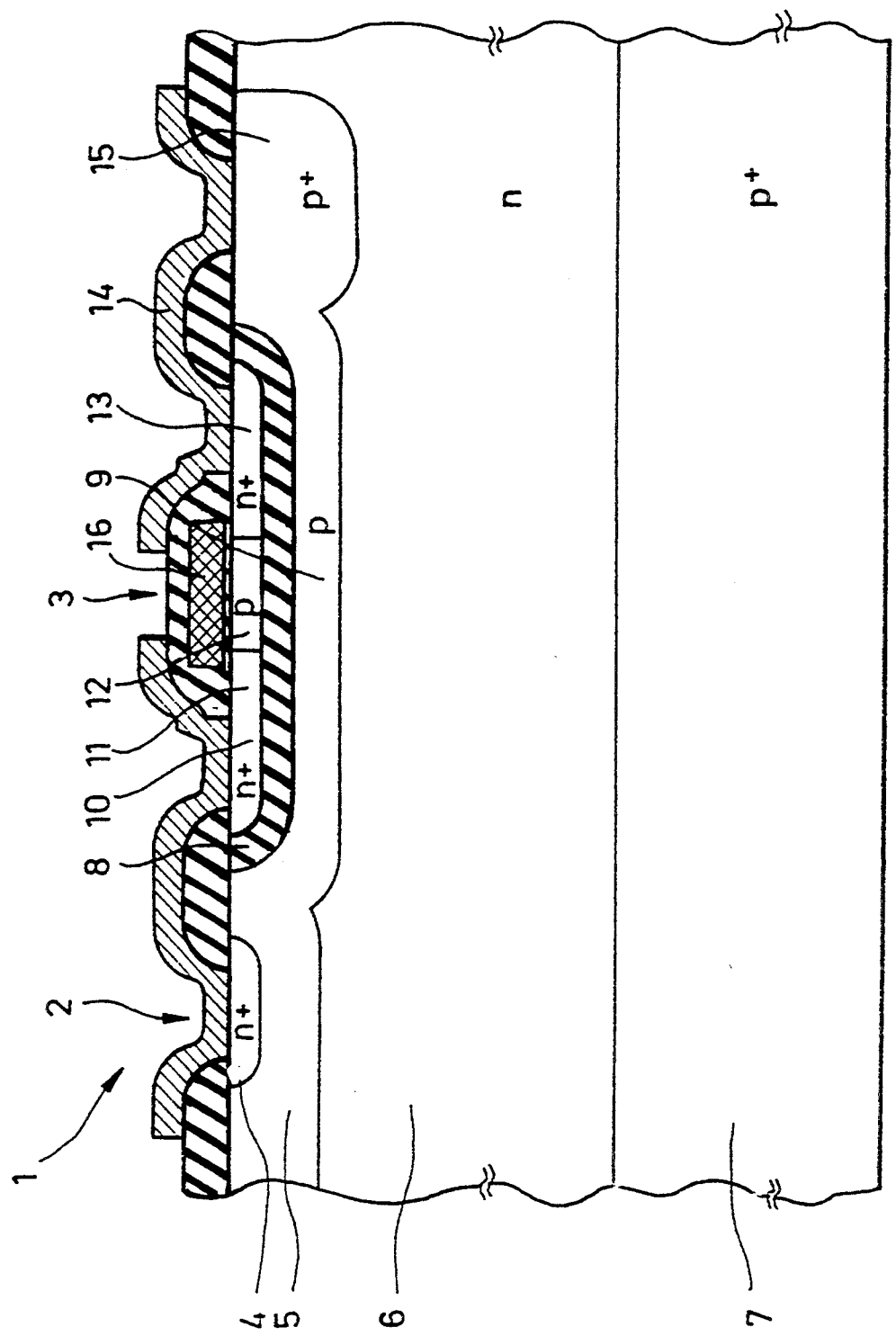
FIG. 1 shows a first embodiment of an integrated power switch structure according to the present invention.

As can be seen in FIG. 1, the embodiment of an integrated power switch structure according to the present invention, which is shown in said FIG. 1 and which is designated generally by reference numeral 1, essentially comprises a vertical thyristor 2 as well as a lateral NMOS-FET with its gate G3. The thyristor 2 has an $n^+pnp^+$-four-layer structure comprising an $n^+$-layer 4, a p-base layer 5, an n-base layer and n-epi-layer 6, respectively, as well as a $p^+$-substrate 7. The $n^+$-layer 4 defines the cathode of the thyristor 2, whereas the $p^+$-substrate 7 represents the anode thereof. The lateral MOS transistor 3 is insulated from the residual power switch structure 4 to 7 by a buried, essentially trough-shaped oxide layer 8. Said buried oxide layer 8 is placed on top of a doped layer 9, which is doped contrary to the n-epi-layer 6 positioned below said doped layer and which merges with the p-base layer 5 of the vertical transistor 2.

The buried oxide layer 8 can be produced by local high-dose implantation of oxygen in the silicon. A high-quality buried oxide will be obtained by subsequent tempering. The lateral MOS transistor 3 can be integrated directly into the silicon layer or silicon island 10 positioned on top of said oxide layer 8. Said lateral MOS transistor 3 comprises an $n^+$-region 11 defining the drain electrode, a p-region 12 defining the channel, and an $n^+$-region 13, which represents the source electrode of the NMOS transistor 3 and which defines simultaneously the cathode of the power switch structure formed by the thyristor 2 as well as by the MOS transistor 3. The contact means 14 following the source electrode 13 is additionally connected to a $p^+$-region 15 which borders on the p-doped layer 9.

Figure 2:
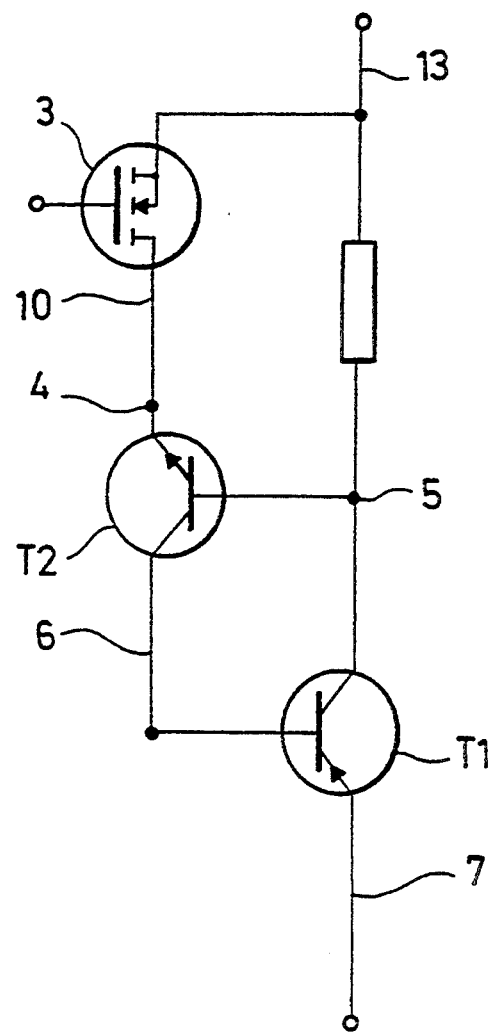
FIG. 2 shows an equivalent circuit of the power switch structure shown in FIG. 1.

It is obvious that in the case of the power switch structure according to the present invention the drain-source path 10, 13 of the lateral MOS transistor 3 is connected in series with the cathode-anode path 4, 5, 6, 7 of the thyristor 2. The current is thus switched directly, but not indirectly by short-circuiting the highest possible percentage of the base current of the npn-bipolar transistor T2. As can especially be seen from the equivalent circuit according to FIG. 2, in which like reference numerals have been used to designate areas which correspond to those shown in FIG. 1, it is also impossible that a parasitic thyristor occurs in the case of the integrated power switch structure according to the present invention. The source connection 13 is dielectrically insulated against the substrate and is no longer a constituent part of an npnp-four-layer structure 4, 5, 6, 7, which, in the case of firing, makes safe switching off of large currents impossible. The total current of the power switch structure according to the present invention must flow via the channel 12 of the lateral MOS transistor 3 and can be controlled by the gate 16 thereof. It is obvious that, in the case of the power switch structure according to the present invention, the blocking voltage drops at the space-charge zone within the four layer structure of the thyristor 2 so that the MOS transistor 3 does not require high dielectric strength. It follows that the MOS transistor can be constructed such that it has a comparatively low channel resistance. The switch-on resistance of the whole power switch structure lies between that of a thyristor and that of an IGTB. The resistance of the epitaxial layer is negligible so that the switch-on resistance is predominantly determined by the channel resistance of the MOS transistor 3, which can be comparatively low for the reasons stated hereinbefore. In view of the fact that the dielectric strength is determined by the doping and by the dimensions of the epitaxial layer 6, it is possible to produce power switches having at 500 V blocking voltage a switch-on resistance which is smaller than that of an IGBT. This will contribute to a reduction of the area occupied by the component in question, when boundary conditions, such as the switch-on resistance or the admissible dissipation power, are predetermined.

Figure 3:
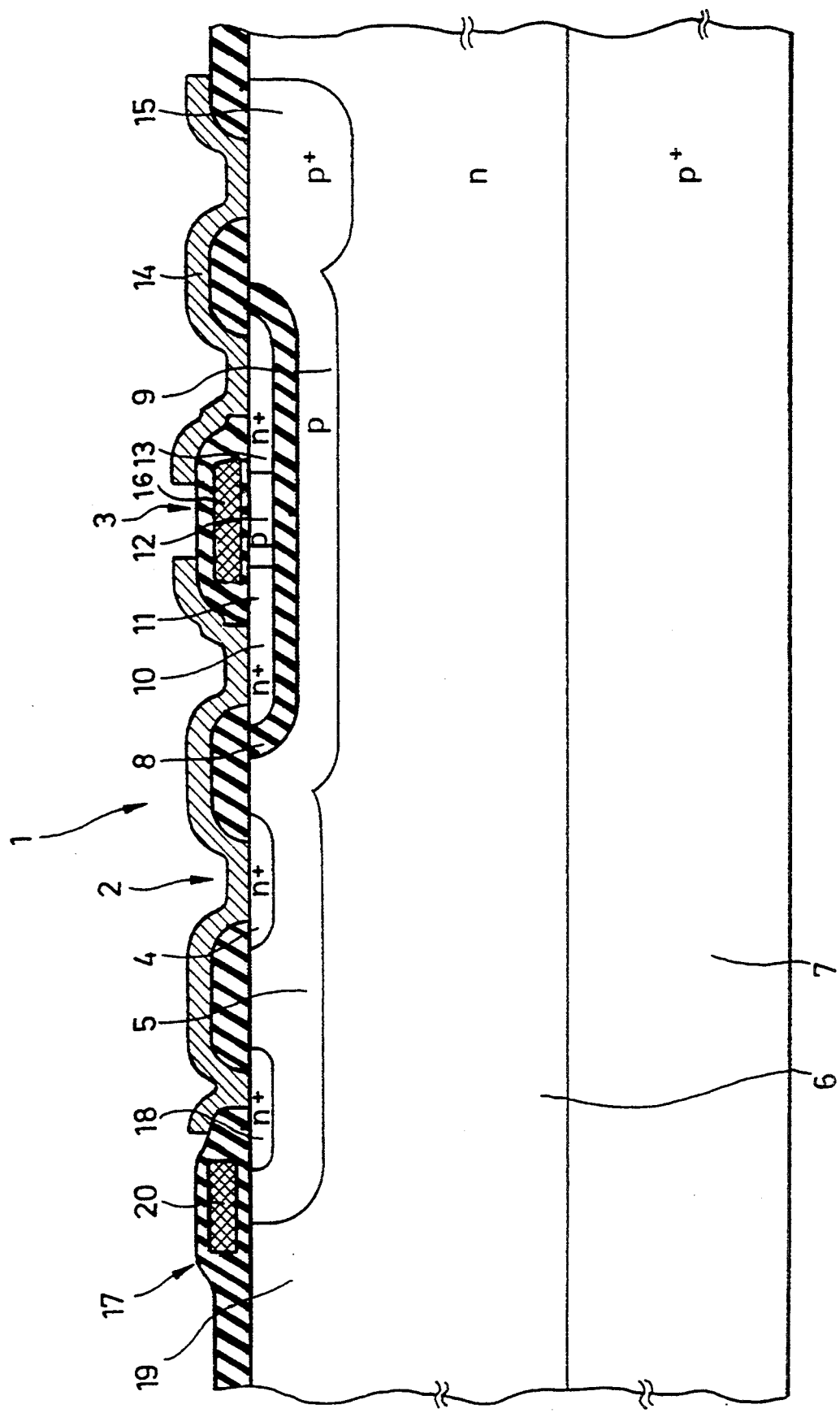
FIG. 3 shows a second embodiment of the integrated power switch structure according to the present invention.
Figure 4:
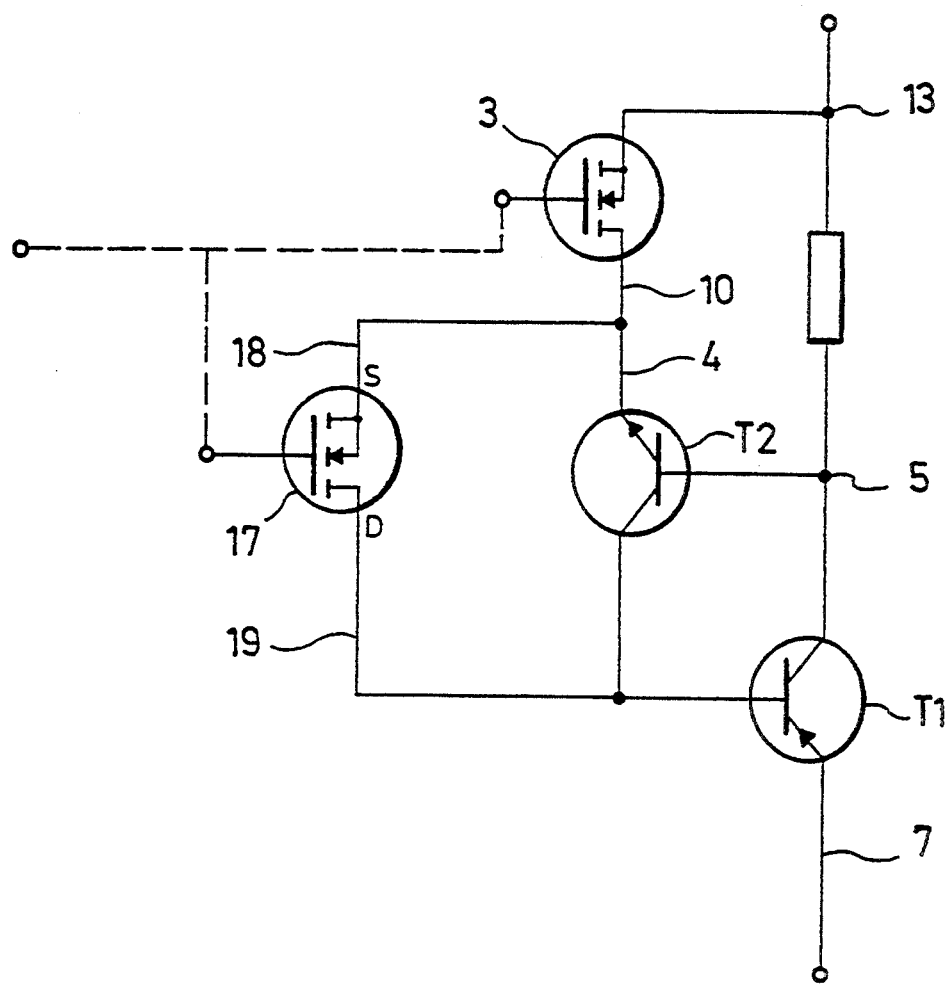
FIG. 4 shows an equivalent circuit of the power switch structure according to FIG. 3.
Figure 5:
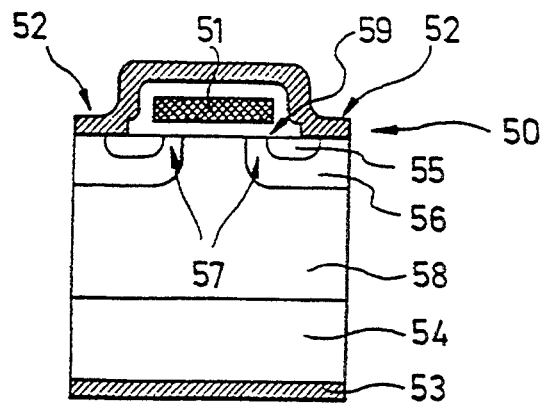
FIG. 5 shows a power DMOS transistor according to the prior art.
Figure 6:
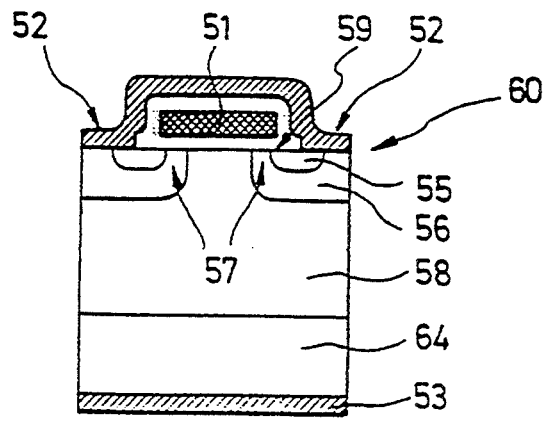
FIG. 6 shows a bipolar transistor controlled by an MOS gate according to the prior art.
Figure 7:
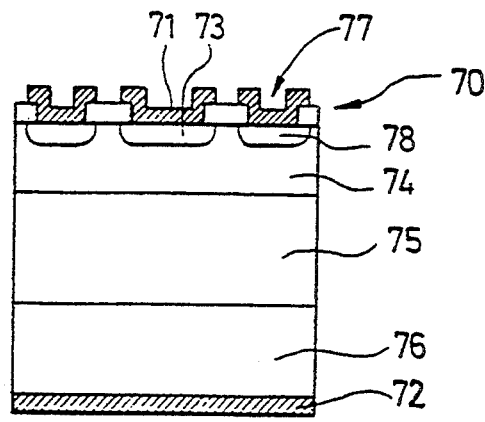
FIG. 7 shows a thyristor with a switch-off gate according to the prior art.
Figure 8:
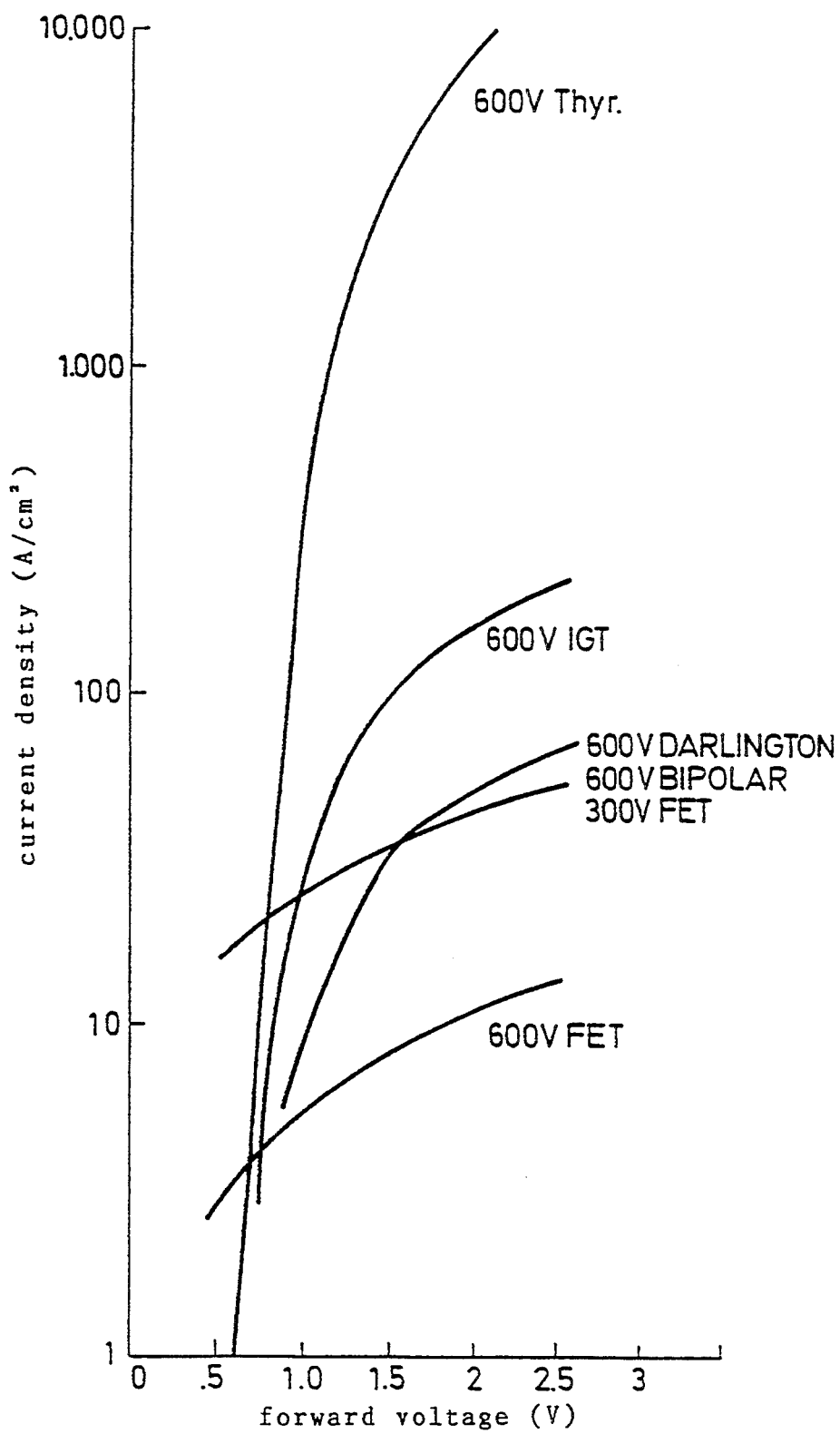
FIG. 8 shows the correlation of current density and conducting voltage in the case of various types of power switch means.
Figure 9:
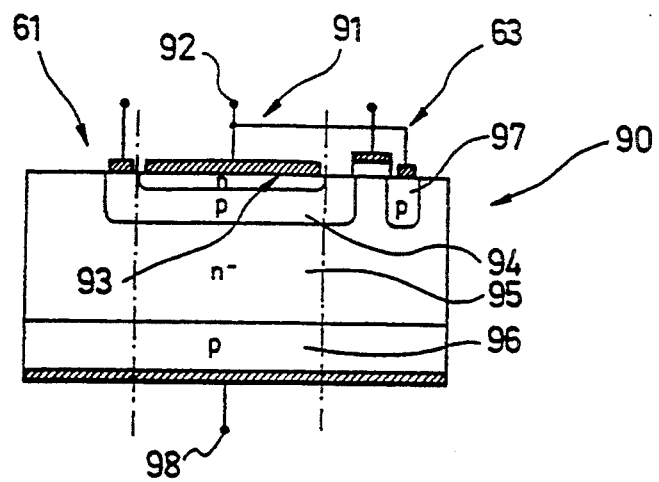
FIG. 9 shows a known thyristor which is adapted to be switched on via an MOS gate.
Figure 10:
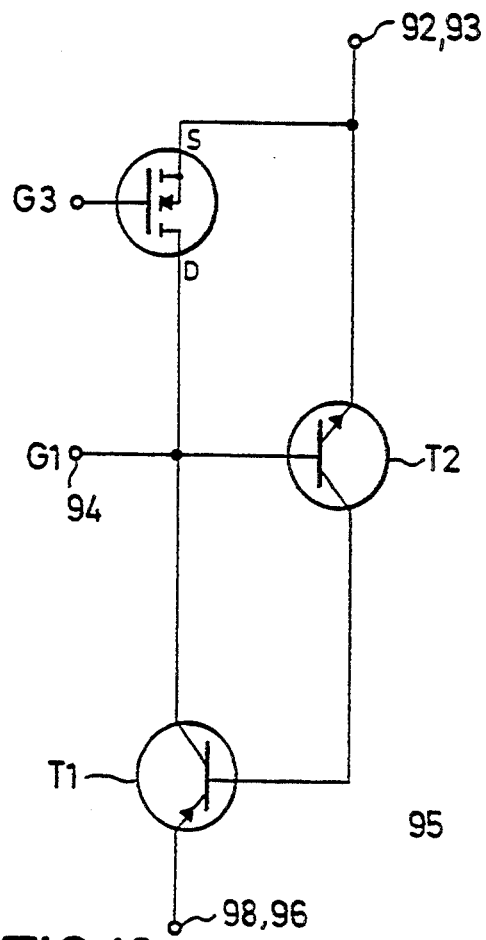
FIG. 10 shows an equivalent circuit of the thyristor according to FIG. 9.
Figure 11:
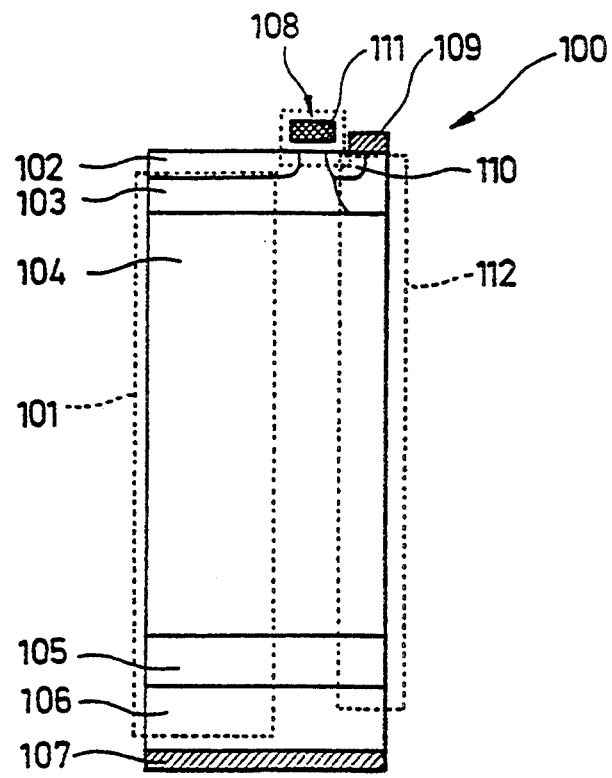
FIG. 11 shows an additional MOS gate-controllable thyristor according to the prior art.
Figure 12:
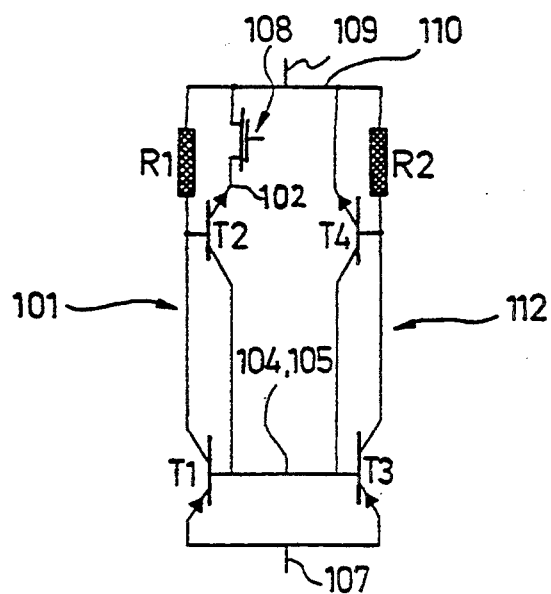
FIG. 12 shows an equivalent circuit of the thyristor according to FIG. 11.

A modified embodiment of the power switch structure 1 according to the present invention is shown in FIG. 3. With the exception of the deviation explained hereinbelow, the embodiment of the power switch structure according to FIG. 3 corresponds to that according to FIG. 1 so that a renewed explanation of the corresponding areas, which are designated by like reference numerals, can be dispensed with. Accordingly, also the equivalent circuit according to FIG. 4 corresponds identically to that according to FIG. 2 with the exception of the deviation explained hereinbelow.

The power switch structure according to FIG. 3 additionally comprises a further MOS gate and a further MOS transistor 17, respectively, whose source electrode 18 is defined by an $n^+$-region within the p-base layer 5 and whose drain 19 merges with the n-base layer 6. The channel of the MOS transistor 17 is defined by the p-layer 5 above which the gate 20 of the MOS transistor 17 is positioned. As can be seen from the equivalent circuit according to FIG. 4, the gate of the lateral MOS transistor 3 is preferably connected with that of the additional MOS transistor 17.

The additional MOS gate 17 serves to switch on the thyristor 2 of the power switch structure 1. When a positive voltage is applied to the gate 20, a channel is activated, which, similar to an IGBT, injects a current into the n-doped epitaxial layer 6. If, as in the case of the embodiment according to FIG. 3, the gate 20 of the additional MOS transistor 17 is connected to the gate 16 of the lateral MOS transistor 3, the current to be controlled can be switched on with a single control electrode, if the gate-source voltage is higher than the threshold voltage of the transistors 3 and 17, or switched off, if said gate-source voltage is lower than said threshold voltage.

Deviating from the structure shown hereinbefore, it is also possible to use respective inverse dopings.

Furthermore, it is possible to use a lateral thyristor instead of a vertical thyristor.

We claim:

1. An integrated power switch structure, which comprises a vertical thyristor controlled by a lateral MOS transistor, wherein said thyristor is constructed as a four-layer thyristor comprising an anode layer, a first base layer doped contrary to said anode layer, an additional base layer doped contrary to said first base layer, and a cathode layer, characterized in that in the main current path of the said power switch structure, said lateral MOS transistor has its drain-source path connected in series with the cathode-anode path of the thyristor, a buried oxide layer insulates at least a source electrode of the lateral MOS transistor against the substrate, and the first base layer is arranged below said source electrode.

2. An integrated power switch structure according to claim 1, characterized in that said buried oxide layer encloses said lateral MOS transistor in a trough-like manner.

3. An integrated power switch structure according to claim 2, characterized in that said thyristor is provided with a vertical npnp four-layer structure, said buried oxide layer lies in an additional p-base layer bordering on a n-cathode layer, and that said lateral MOS transistor is an NMOS transistor whose drain electrode is connected to said cathode of the thyristor and whose source electrode defines together with said anode layer of said thyristor the main current path of the power switch structure.

4. An integrated power switch structure according to claim 1, characterized by an additional MOS transistor, positioned on said structure so that when an adequate input voltage is applied to its gate electrode, charge carriers will be injected into said first base layer of an npnp-four-layer structure of the thyristor, said first base layer bordering on said anode layer.

5. An integrated power switch structure according to claim 4, characterized in that said gate electrode of said additional MOS transistor is connected to a gate electrode of said lateral MOS transistor.

6. An integrated power switch structure according to claim 4, characterized in that said additional MOS transistor is an NMOS transistor whose source electrode is connected to a n+-cathode layer of said thyristor and whose drain electrode is defined by said first base layer bordering on said anode layer.

7. An integrated power switch structure according to claim 1, characterized in that a layer doped contrary to said first base layer is provided between said buried oxide layer and said first base layer, and that said layer encloses said buried oxide layer.

8. An integrated power switch structure according to claim 7, characterized in that said layer doped contrary to the said first base layer merges with said additional base layer of said thyristor.

9. An integrated power switch structure according to claim 7, characterized in that a region, which is highly doped contrary to said first base layer, borders on said layer doped contrary to said first base layer and is connected to the source electrode of said lateral MOS transistor.

10. An integrated power switch structure according to claim 2, characterized in that said thyristor is provided with a vertical npnp four-layer structure, said buried oxide layer lies in said p-doped layer bordering on said additional base layer, and that said lateral MOS transistor is an NMOS transistor having a drain electrode connected to said cathode of said thyristor and having a source electrode which defines together with said anode layer of said thyristor the main current path of the power switch structure.

* * * * *